(12) United States Patent
Vanselow et al.

(10) Patent No.: US 7,385,539 B2
(45) Date of Patent: Jun. 10, 2008

(54) ALL-DIGITAL PHASE LOCKED LOOP (ADPLL) SYSTEM

(75) Inventors: Frank Vanselow, Freising (DE); Chung San Roger Chan, Coppell, TX (US)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 11/675,003

(22) Filed: Feb. 14, 2007

(65) Prior Publication Data

US 2007/0205931 A1 Sep. 6, 2007

Related U.S. Application Data

(60) Provisional application No. 60/882,373, filed on Dec. 28, 2006.

(30) Foreign Application Priority Data

Feb. 15, 2006 (DE) ............... 10 2006 007 022

(51) Int. Cl.
*H03M 3/00* (2006.01)
(52) U.S. Cl. .................. 341/143; 331/1 A; 331/16; 331/17; 331/36 C; 331/179; 375/376
(58) Field of Classification Search ............. 341/143
See application file for complete search history.

(56) References Cited

U.S. PATENT DOCUMENTS 6,414,555 B2* 7/2002 Staszewski et al. ............ 331/18

6,606,004 B2* 8/2003 Staszewski et al. ............ 331/17

(Continued)

FOREIGN PATENT DOCUMENTS

DE 103 09 335 3/2000

(Continued)

OTHER PUBLICATIONS

Mitcahit Kozak and Izzet Kale: "A Pipelined Noise Shaping Coder for Fractional-N Frequency Synthesis," IEEE Transactions on Instrumentation and Measurement, vol. 50, No. 5, Oct. 2001, pp. 1154-1161.

*Primary Examiner*—Khai M. Nguyen
(74) *Attorney, Agent, or Firm*—Warren L. Franz; Wade J. Brady, III; Frederick J. Telecky, Jr.

(57) ABSTRACT

An all-digital phase locked loop system for generating an oscillator output signal under control of a digital reference input. The system comprises a digitally controlled oscillator, a digital loop filter for generating a multiple bit digital control signal for the digitally controlled oscillator, a sigma-delta modulator for generating an additional 1-bit digital control signal for the digitally controlled oscillator, a digital divider dividing the oscillator output signal and providing a digital divided signal, and a digital adder with a first, additive input to which the digital reference input is applied and a second, subtractive input to which the digital divided signal is applied. The digital adder provides a digital output, the most significant bits of which are applied to an input of the digital loop filter and the least significant bits of which are applied to an input of the sigma-delta modulator. In the preferred embodiment, the sigma-delta modulator is of a two-stage MASH configuration.

9 Claims, 3 Drawing Sheets

U.S. PATENT DOCUMENTS

| | | |
|---|---|---|
| 6,658,748 B1 | 12/2003 | Leipold et al. |
| 7,046,098 B2 * | 5/2006 | Staszewski ................. 331/158 |
| 7,109,805 B2 * | 9/2006 | Lee et al. ..................... 331/23 |
| 2007/0222526 A1 * | 9/2007 | Mayer et al. ................. 331/34 |

FOREIGN PATENT DOCUMENTS

DE 103 08 921 2/2003

* cited by examiner

ALL-DIGITAL PHASE LOCKED LOOP (ADPLL) SYSTEM

CROSS-REFERENCE TO RELATED APPLICATIONS

This application claims foreign priority under 35 USC 119 of DE 10 2006 007 022.4 filed Feb. 15, 2006; and also claims domestic priority under 35 USC 119 of U.S. No. 60/882,373 filed Dec. 28, 2006.

FIELD OF THE INVENTION

The invention relates to an all-digital phase locked loop system for generating an oscillator output signal under control of a digital reference input.

BACKGROUND

An all-digital phase locked loop (ADPLL) generally comprises a digitally controlled oscillator (DCO), a digital loop filter that applies a multiple bit control word to the DCO, a digital adder with an output that feeds the input of the loop filter and a first input that receives a digital reference input, and a digital divider for dividing the output of the oscillator and applying the divided oscillator output to a second, subtracting input of the digital adder. Since the smallest possible frequency step with such an ADPLL is given by the frequency of the reference input, fractional division has been introduced by incorporating in the loop a sigma-delta modulator which modulates the division ratio. See Kozak et al., "A Pipelined Noise Shaping Coder for Fractional-N Frequency Synthesis," IEEE Transactions on Instrumentation and Measurement, Vol. 50, No. 5, October 2001. This document also discloses a multi-stage noise shaping (MASH) technique for a sigma-delta modulator.

SUMMARY

The invention takes a different approach in that it is not the division ratio that is modulated. Rather, it is the least significant bit of the control word applied to the DCO that is modulated by the sigma-delta modulator. Specifically, a described embodiment of the inventive all-digital phase locked loop system for generating an oscillator output signal under control of a digital reference input, comprises a digitally controlled oscillator (DCO), a digital loop filter for generating a multiple bit digital control signal for the digitally controlled oscillator, a sigma-delta modulator for generating an additional 1-bit digital control signal for the digitally controlled oscillator, a digital divider dividing the oscillator output signal and providing a digital divided signal, and a digital adder with a first, additive input to which the digital reference input is applied and a second, subtractive input to which the digital divided signal is applied. The digital adder provides a digital output, the most significant bits of which are applied to an input of the digital loop filter and the least significant bits of which are applied to an input of the sigma-delta modulator.

Using the sigma-delta modulator in the ADLL increases the frequency resolution. However, noise and spurs are also produced by the sigma-delta modulator. The phase noise power is raised due to the spurious frequencies generated by the sigma-delta modulator.

Generally, there are two ways to reduce the noise and spurs of the sigma-delta modulator. One way is to increase the sampling frequency. The sampling frequency is limited by the technology employed. The second way is to increase the order of the sigma-delta. Increasing the order of the sigma-delta modulator results in a 6 dB improvement per order. However, stability is a major problem with sigma-delta modulators of higher order.

In a preferred example embodiment of the invention, the sigma-delta modulator is of a two-stage MASH 1-1 configuration. Because a sigma-delta modulator tends to generate periodic spurs for a relatively static signal input, the invention further provides a dithering mechanism which reduces such spurs. The dithering mechanism introduces a small signal in the loop with a non-zero time average value. Specifically, each stage of the sigma-delta modulator includes a quantizer with an input to which a dithering value is added.

It has been demonstrated that a 2nd order sigma-delta modulator with a Mash 1-1 architecture has advantages in terms of noise reduction and stability over conventional higher order sigma-delta modulators. But it was also found that the critical path in terms of speed is from the adder output register through the quantizer, multiplexer, subtractor and the adder back to the register. To improve the speed, parallelism is employed in each of the two stages of the sigma-delta modulator. Specifically, in the preferred example embodiment of the invention, each stage of the sigma-delta modulator comprises two input parallel channels each with a subtractor, a channel register and an adder, and further comprises a multiplexer, a stage register, an adder and a quantizer. The subtractor of the first channel has a first n-bit wide input and a second n-bit wide input. The subtractor of the second channel has a first n-bit wide input and a second n-bit wide input. The first input of the subtractor in the first channel receives an n-bit wide digital input signal.

The first input of the subtractor in the second channel receives the same n-bit wide digital input signal as the subtractor in the first channel. The second input of the subtractor in the first channel receives a digital signal equivalent to $+2^n$. The second input of the subtractor in the second channel receives a digital signal equivalent to $-2^n$. The output of the subtractor in the first channel is connected to an input of the channel register in the same channel. The output of the subtractor in the second channel is connected to an input of the channel register in the same channel. The channel register in the first channel has an (n+2)-bit wide output connected to a first input of the adder of the first channel. The channel register in the second channel has an (n+2)-bit wide output connected to a first input of the adder of the second channel. The adder of the first channel has an output connected to a first input of the multiplexer. The adder of the second channel has an output connected to a second input of the multiplexer. The multiplexer has an output connected to an input of the stage register. The quantizer receives an input from the stage register and provides a digital 1-bit output applied to a control input of the multiplexer. In this embodiment, the subtraction is removed from the critical path, subtractions of the negative and the positive feedback value being performed in parallel in the previous stage. The two results are then added simultaneously with the feedback value. Depending on the result of the quantizer, or slicer, the output of which controls the multiplexer, the correct value is then passed on to the output register. Still preferably, each stage has an adder with a first input connected to the output of the stage register, a second input to which a dithering value is applied and an output connected to the input of the quantizer.

DETAILED DESCRIPTION OF EXAMPLE EMBODIMENTS

Figure 1:
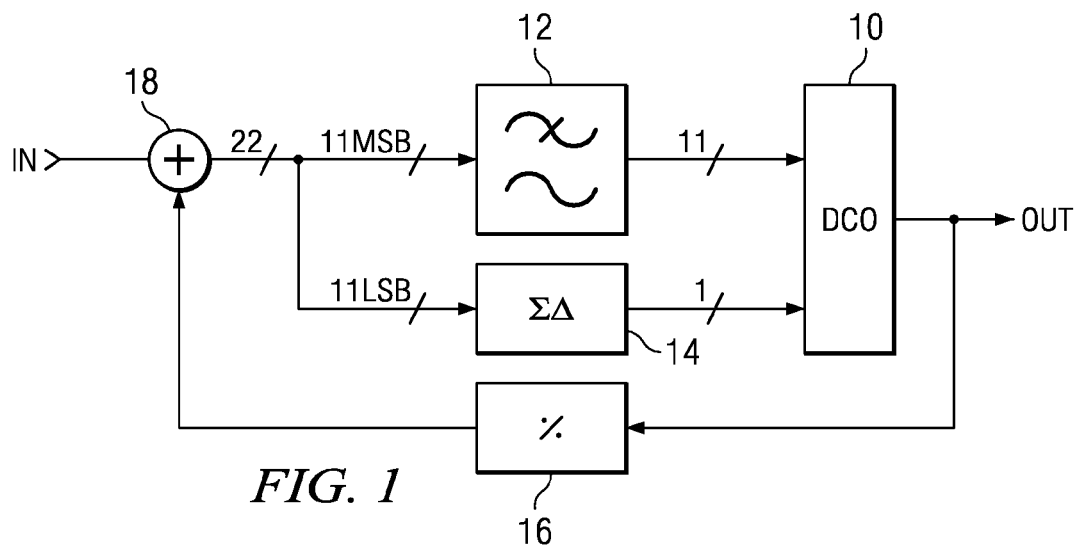
FIG. 1 is a schematic block diagram of an example of an all-digital phase locked loop system according to the principles of the invention.

The all-digital phase locked loop in FIG. 1 comprises a digitally controlled oscillator 10, the output of which provides a desired oscillator signal OUT; a loop filter 12 providing the most significant control bits to the oscillator 10; a sigma-delta modulator 14 providing the least significant control bit to the oscillator 10; a feedback divider 16 dividing the oscillator signal OUT by an integer; and an input adder 18 which receives an input signal IN from which it subtracts the divided feedback signal. In the described example embodiment, the input adder has a 22-bit output, the most significant 11 bits of which are applied to an input of the loop filter 12 and the least significant 11 bits of which are applied to the input of the sigma-delta modulator 14.

Figure 2:
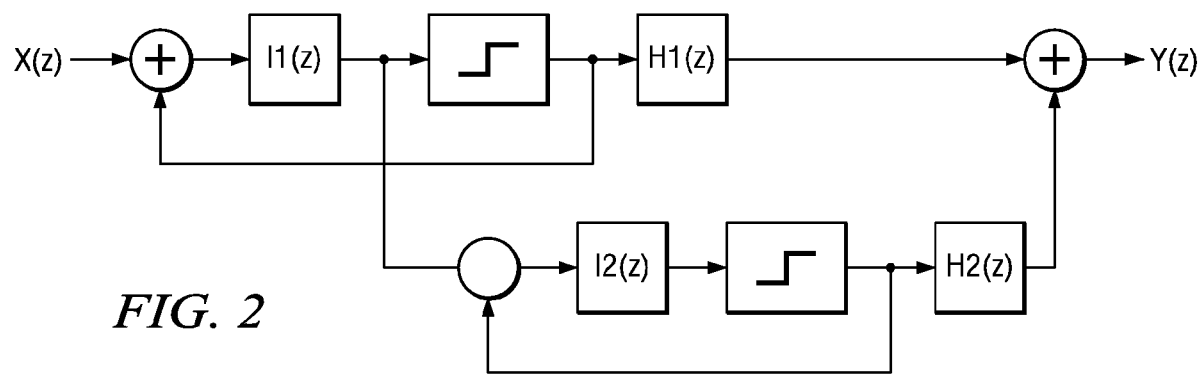
FIG. 2 is a schematic diagram of an example sigma-delta modulator in a MASH 1-1 configuration.

As discussed above, a sigma-delta modulator in an ADPLL tends to produce noise and spurs, especially with a relatively static input. Rather than increasing the order of the sigma-delta in an attempt to reduce the noise, the preferred embodiment uses a sigma-delta modulator 14 with a MASH 1-1 architecture, i.e., it has two stages each of first order, the second stage having its input connected to the input of the quantizer stage and its output added to the output of the first stage. Specifically, as seen in FIG. 2, the first stage has an input adder that receives the input signal $X(z)$ and feeds its output to a delay circuit $I1(z)$, which feeds a quantizer the output of which is provided to an output adder through a further delay circuit $H1(z)$. The output of the quantizer is also subtracted from the input $X(z)$. The second stage is of a similar configuration, the delay circuits therein being designated $I2(z)$ and $H2(z)$, respectively, but the input is taken after the delay circuit $I1(z)$ of the first stage and the output is added to the output of the first stage to provide the output signal $Y(z)$.

Figure 3:
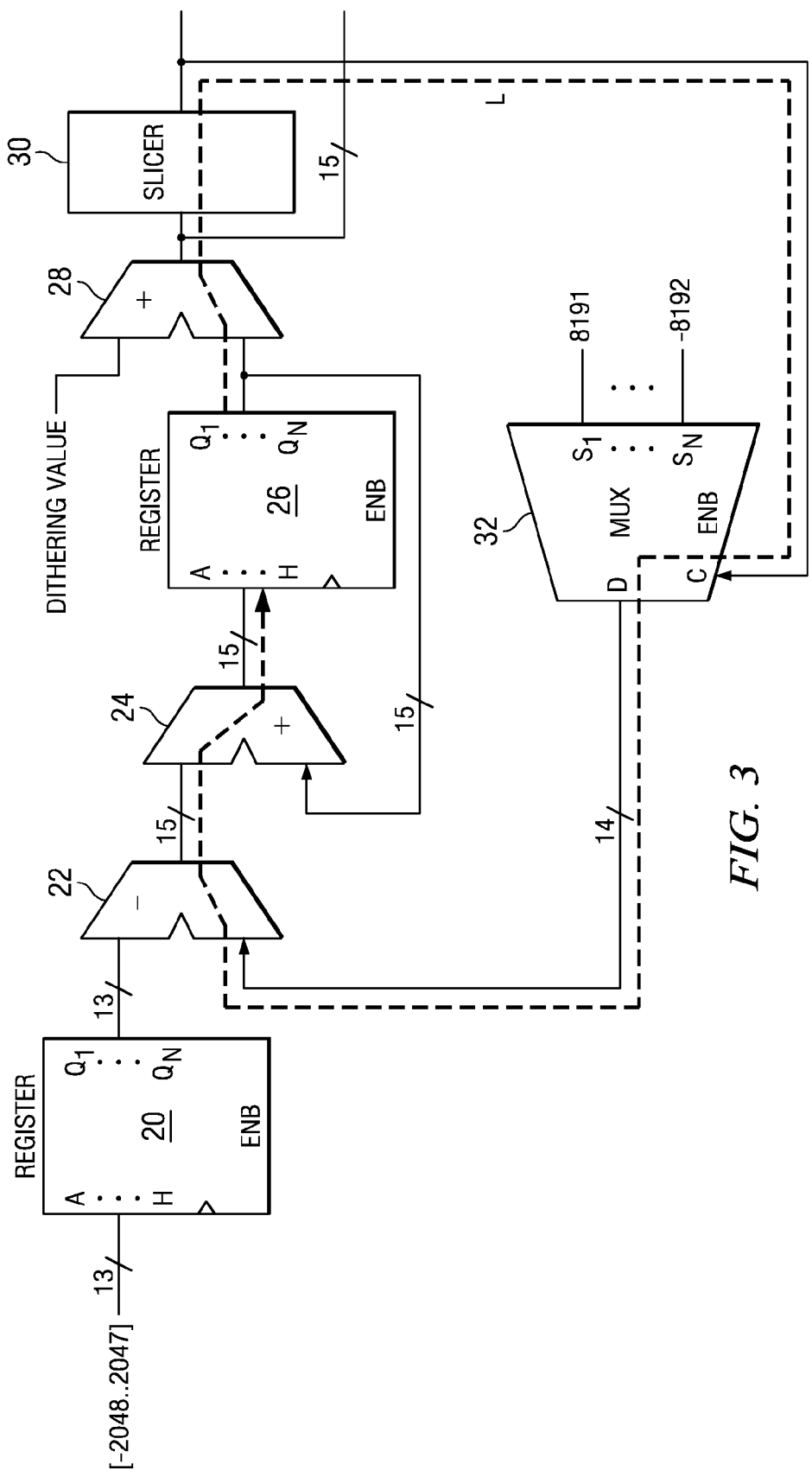
FIG. 3 is a diagram showing an example of a digital implementation of one of the two stages in FIG. 1.

FIG. 3 shows a digital implementation of one stage of the modulator in FIG. 2 with an additional dithering mechanism.

In FIG. 3, an input register 20 is followed by a subtractor 22, a first input of which receives the output of register 20 and the output of which is fed to a first input of an adder 24. The output of adder 24 is supplied to a register 26, and the output of register 26 is applied to a first input of an adder 28 and to a second input of adder 24. A second input of adder 28 receives a dithering value. A dithering value is a digital signal representing a noise of a non-zero time-average. The adder 28 adds the dithering value to the output of register 26 to modulate the fractional bits. The output of adder 28 is applied to a quantizer 30, the output of which is simply the most significant bit MSB of its digital input value. The output of quantizer 30 is applied to a control input of a multiplexer 32 which has two inputs and an output connected to a second input of subtractor 22. The first input of multiplexer 32 receives a constant positive digital value, corresponding to a decimal value of +8191 in the example shown, and the second input of multiplexer 32 receives a constant negative digital value, corresponding to a decimal value of −8191 in the example shown. Generally, if the input to the stage is n-bits wide, the positive digital value is equivalent to $+2^n$ and the negative digital value is equivalent to $-2^n$. Depending on the MSB of the quantizer output, the adder 22 adds either the positive or the negative digital value to the output of register 20.

It should be understood that both stages of the sigma-delta modulator are of a similar configuration, and both stages are connected in a MASH 1-1 configuration as shown in FIG. 2. Compared to a conventional sigma-delta modulator of second order, the feedback loop is shortened by a factor of 2 with the MASH 1-1 structure. Moreover, the number of input bits can be reduced by one bit, requiring a smaller adder. Stability of the circuit is also ensured with this structure.

In the FIG. 3 design, it can be demonstrated that the critical path in terms of speed is the loop from the subtractor 22 through adder 24, register 26, adder 28, quantizer 30, multiplexer 32 back to subtractor 22. In FIG. 3, the critical path is indicated by a dashed line "L".

Figure 4:
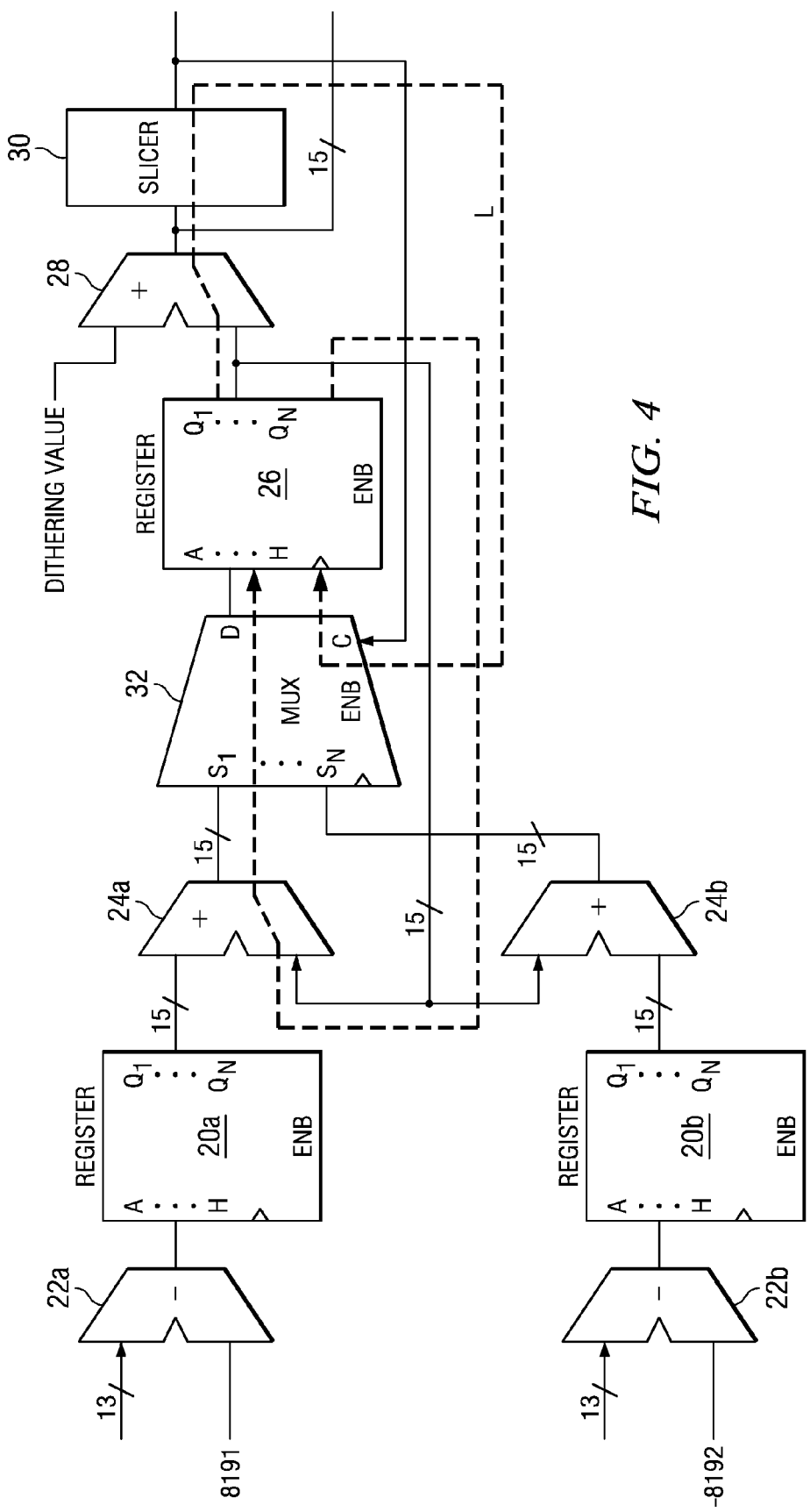
FIG. 4 is a preferred example of digital implementation of each stage of the modulator.

In a further aspect of the invention, parallelism is employed to improve the speed of the sigma-delta modulator, as will become apparent from the following description with reference to FIG. 4. Since the structure in FIG. 4 is generally similar to that in FIG. 3, similar reference numerals are used to refer to similar components.

In the embodiment of FIG. 4, the subtractor 22 of FIG. 3 is removed from the critical path and shifted to the input of the stage. Specifically, the circuit in FIG. 4 has two parallel input channels. A first input channel comprises subtractor 22a, register 20a and adder 24a. A second input channel comprises subtractor 22b, register 20b and adder 24b. The input to the stage of the sigma-delta modulator is applied in parallel to both subtractors 22a and 22b. A second input to subtractor 22a is the constant positive digital value, again assumed to correspond to a decimal +8191 in the example; and a second input to subtractor 22b is the constant negative digital value, again assumed to correspond to a decimal −8192 in the example. Both adders 24a and 24b in parallel receive the loop feedback from the output of register 26. The multiplexer 32 has its inputs connected to the outputs of adders 24a, 24b, and its output connected to the input of register 26. In this embodiment, the subtraction (delta) is removed from the critical path and subtractions are done in parallel, i.e., simultaneously, in the input channels. The two results are then added (sigma) simultaneously to the feedback value. Depending on the result from the quantizer 30, the correct value is then selected and passed to register 26. Parallelism in this embodiment drastically improves the speed of the stage because the dithering addition and the slicing by quantizer 30 are done in parallel with the accumulation.

As in FIG. 3, the critical path in FIG. 4, in terms of speed, is indicated by a dashed line "L". As is seen, the critical path has been shortened by eliminating the subtractor. The increase in speed is achieved at the moderate expense of doubling an input channel of the stage.

Those skilled in the art to which the invention relates will appreciate that the foregoing are merely examples, and that modifications to the described embodiments and other embodiments exist, within the scope of the claimed invention.

What is claimed is:

1. An all-digital phase locked loop system for generating an oscillator output signal under control of a digital reference input, comprising:

a digitally controlled oscillator;

a digital loop filter for generating a multiple bit digital control signal for the digitally controlled oscillator;

a sigma-delta modulator for generating an additional 1-bit digital control signal for the digitally controlled oscillator;

a digital divider for dividing the oscillator output signal and providing a digital divided signal; and a digital adder for subtracting the digital divided signal from the digital reference input, and providing a digital output, the most significant bits of which are applied to an input of the digital loop filter and the least significant bits of which are applied to an input of the sigma-delta modulator.

2. The system of claim 1, wherein the sigma-delta modulator comprises a two-stage MASH configuration.

3. The system of claim 2, wherein each stage of the sigma-delta modulator includes a quantizer with an input to which a dithering value is added.

4. The system of claim 3, wherein each stage of the sigma-delta modulator comprises two parallel channels each with a subtractor, a channel register and an adder.

5. The system of claim 4, further comprising a multiplexer, a stage register, an adder and a quantizer.

6. The system of claim 5, wherein the subtractor of the first channel has a first n-bit wide input and a second n-bit wide input; the subtractor of the second channel has a first n-bit wide input and a second n-bit wide input; the first input of the subtractor in the first channel receives an n-bit wide digital input signal; the first input of the subtractor in the second channel receives the same n-bit wide digital input signal as the subtractor in the first channel; the second input of the subtractor in the first channel receives a digital signal equivalent to $+2^n$; the second input of the subtractor in the second channel receives a digital signal equivalent to $-2^n$; the output of the subtractor in the first channel is connected to an input of the channel register in the same channel; the output of the subtractor in the second channel is connected to an input of the channel register in the same channel; the channel register in the first channel has an (n+2)-bit wide output connected to a first input of the adder of the first channel; the channel register in the second channel has a (n+2)-bit wide output connected to a first input of the adder of the second channel; the adder of the first channel has an output connected to a first input of the multiplexer; the adder of the second channel has an output connected to a second input of the multiplexer; the multiplexer has an output connected to an input of the stage register; the quantizer receiving an input from the stage register and providing a digital 1-bit output applied to a control input of the multiplexer.

7. The all-digital phase locked loop system according to claim 6, wherein each stage has an adder with a first input connected to the output of the stage register, a second input to which a dithering value is applied and an output connected to the input of the quantizer.

8. The all-digital phase locked loop system according to claim 2, wherein each stage of the sigma-delta modulator comprises two parallel channels each with a subtractor, a channel register and an adder; and further comprises a multiplexer, a stage register, an adder and a quantizer; and wherein the subtractor of the first channel has a first n-bit wide input and a second n-bit wide input, the subtractor of the second channel has a first n-bit wide input and a second n-bit wide input, the first input of the subtractor in the first channel receives an n-bit wide digital input signal, the first input of the subtractor in the second channel receives the same n-bit wide digital input signal as the subtractor in the first channel, the second input of the subtractor in the first channel receives a digital signal equivalent to $+2^n$, the second input of the subtractor in the second channel receives a digital signal equivalent to $-2^n$, the output of the subtractor in the first channel is connected to an input of the channel register in the same channel, the output of the subtractor in the second channel is connected to an input of the channel register in the same channel, the channel register in the first channel has a (n+2)-bit wide output connected to a first input of the adder of the first channel, the channel register in the second channel has a (n+2)-bit wide output connected to a first input of the adder of the second channel, the adder of the first channel has an output connected to a first input of the multiplexer, the adder of the second channel has an output connected to a second input of the multiplexer, the multiplexer has an output connected to an input of the stage register, the quantizer receiving an input from the stage register and providing a digital 1-bit output applied to a control input of the multiplexer.

9. The system of claim 1, wherein the sigma-delta modulator comprises multiple stages; and wherein each stage of the sigma-delta modulator includes a quantizer with an input to which a dithering value is added.

* * * * *